(12) United States Patent
Mizumura

(10) Patent No.: US 9,802,221 B2
(45) Date of Patent: *Oct. 31, 2017

(54) DEPOSITION MASK PRODUCTION METHOD AND LASER PROCESSING APPARATUS

(71) Applicant: V TECHNOLOGY CO., LTD., Yokohama-shi (JP)

(72) Inventor: Michinobu Mizumura, Yokohama (JP)

(73) Assignee: V Technology Co., Ltd., Yokohama-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/809,086

(22) Filed: Jul. 24, 2015

(65) Prior Publication Data

US 2015/0328662 A1   Nov. 19, 2015

Related U.S. Application Data

(63) Continuation of application No. PCT/JP2013/084811, filed on Dec. 26, 2013.

(30) Foreign Application Priority Data

Jan. 28, 2013   (JP) .................................. 2013-013539

(51) Int. Cl.
| | |
|---|---|
| B44C 1/22 | (2006.01) |
| C03C 15/00 | (2006.01) |
| C03C 25/68 | (2006.01) |
| C23F 1/00 | (2006.01) |
| B05D 3/06 | (2006.01) |
| B05D 1/02 | (2006.01) |

(Continued)

(52) U.S. Cl.
CPC ................ B05D 3/06 (2013.01); B05D 1/02 (2013.01); B23K 26/066 (2015.10); B23K 26/08 (2013.01);

(Continued)

(58) Field of Classification Search
USPC .......................................................... 216/65
See application file for complete search history.

(56) References Cited

U.S. PATENT DOCUMENTS 9,203,028 B2 *   12/2015   Takeda ................. C23C 14/042
2005/0115503 A1   6/2005   Hagiwara et al.

FOREIGN PATENT DOCUMENTS

| JP | H-07-300664 | 11/1995 |
| JP | 2001-237072 A | 8/2001 |

(Continued)

OTHER PUBLICATIONS

International Preliminary Report on Patentability dated Aug. 6, 2015, which issued in PCT/JP2013/084811; and English language translation thereof.

(Continued)

*Primary Examiner* — Roberts Culbert
(74) *Attorney, Agent, or Firm* — McDermott Will & Emery LLP

(57) ABSTRACT

A method including: a first step of forming a mask member having a structure in which a magnetic metal member provided with through-holes is in tight contact with one surface of a film; a second step of forming a plurality of preliminary opening patterns by subjecting the film to penetration processing by irradiating laser beams at predetermined regular positions in the plurality of through-holes; and a third step of performing laser processing so as to form each opening pattern over the corresponding preliminary opening pattern, is provided.

5 Claims, 8 Drawing Sheets

(51) Int. Cl.

| | | |
|---|---|---|
| *C23C 14/04* | (2006.01) | |
| *B23K 37/02* | (2006.01) | |
| *B23K 37/04* | (2006.01) | |
| *B23K 26/08* | (2014.01) | |
| *B23K 26/40* | (2014.01) | |
| *B23K 26/382* | (2014.01) | |
| *B23K 26/066* | (2014.01) | |
| *B23K 101/40* | (2006.01) | |

(52) U.S. Cl.
CPC ............ *B23K 26/382* (2015.10); *B23K 26/40* (2013.01); *B23K 37/0235* (2013.01); *B23K 37/0408* (2013.01); *C23C 14/04* (2013.01); *B23K 2201/40* (2013.01)

(56) References Cited

FOREIGN PATENT DOCUMENTS

| | | | |
|---|---|---|---|
| JP | 2004-190057 A | 7/2004 | |
| JP | 2005-163111 A | 6/2005 | |
| JP | 2005-302457 A | 10/2005 | |
| JP | 2006-188748 A | 7/2006 | |
| JP | 2009-062565 A | 3/2009 | |
| JP | WO 2013105643 A1 * | 7/2013 | ........... C23C 14/042 |

OTHER PUBLICATIONS

Chinese Office Action from Chinese Patent Application No. 201380071351.5, dated May 15, 2017.

* cited by examiner

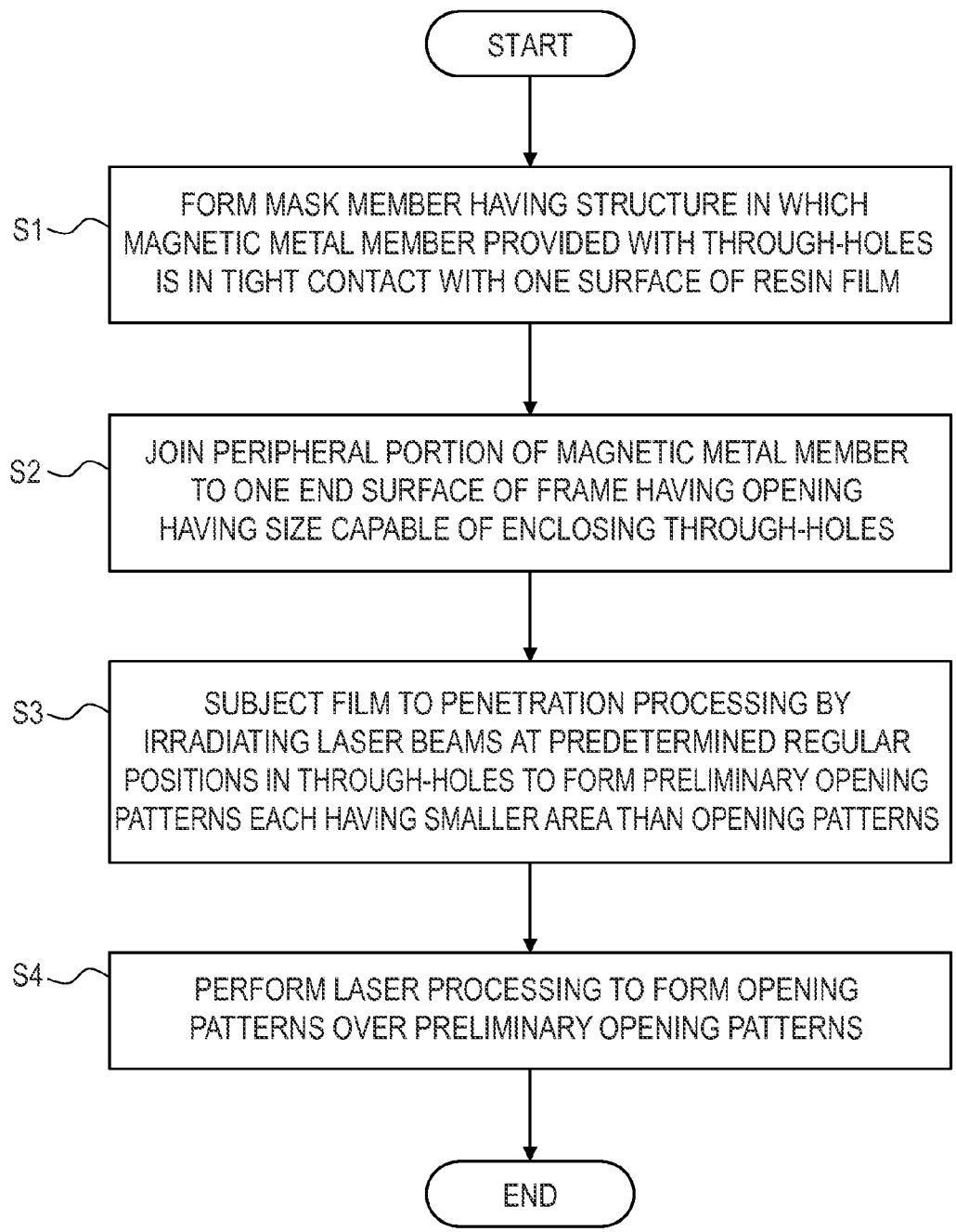

DEPOSITION MASK PRODUCTION METHOD AND LASER PROCESSING APPARATUS

CROSS-REFERENCE TO RELATED APPLICATION

This application is a continuation application of International Application No. PCT/JP2013/084811, filed on Dec. 26, 2013, which is hereby incorporated by reference in its entirety for all purposes.

BACKGROUND OF THE INVENTION

1. Field of the Invention

The present invention relates to a production method of a deposition mask having a structure in which a resin film provided with opening patterns is supported by a magnetic metal member having a thin plate shape, and in particular, relates to a deposition mask production method and a laser processing apparatus, capable of improving positional accuracy in forming opening patterns by laser processing.

2. Description of Related Art

According to a conventional deposition mask production method, a first resist pattern having a plurality of through-holes is formed on a metal plate, and a plurality of penetrating opening patterns is formed in the metal plate by performing an etching treatment through the through-holes of the first resist pattern. Then, the first resist pattern is removed, and a second resist pattern having a plurality of second through-holes each of which exposes a metal edge portion with a predetermined width around each of the plurality of opening patterns, is formed on the metal plate. Then, an etching treatment is performed through the second through-holes of the second resist pattern, so that a mask body around each of the plurality of through-holes, and a peripheral portion positioned around the mask main body and having a thickness greater than a thickness of the mask body, are formed, and thereafter, the second resist pattern is removed (for example, see Japanese Patent Application Laid-open Publication No. 2001-237072).

SUMMARY OF THE INVENTION

However, in the conventional deposition mask production method, since the metal plate is subjected to wet etching treatment to form the plurality of opening patterns penetrating the metal plate, it is difficult to form ultrafine opening patterns with favorable accuracy due to the isotropy of the wet etching. In addition, in a case of a deposition mask for an organic EL display panel, for example, having a large area in which a length of one side is several tens of cm or greater, it is difficult to uniformly form the opening patterns on the entire mask surface due to the occurrence of etching irregularities.

Accordingly, the inventor has proposed a composite-type deposition mask having a structure in which a resin film in which opening patterns having a shape and dimensions that are the same as those of thin-film patterns to be deposited to a substrate are formed at positions corresponding to the thin-film patterns, and a magnetic metal member having a thin plate shape and formed with through-holes capable of enclosing therein the opening patterns, are in tight contact with one another.

The composite-type deposition mask is formed by forming the opening patterns by laser processing in the thin resin film having a thickness of about 10 μm to 30 μm, and has a feature that it is possible to form the ultrafine opening patterns with favorable accuracy, and to uniformly form the opening patterns over the entire mask surface of the deposition mask having a large area as described above.

Meanwhile, in the composite-type deposition mask, when the opening patterns are formed by laser processing after the magnetic metal member having a small thermal expansion coefficient such as Invar or an Invar alloy is brought into tight contact with a member having a relatively greater thermal expansion coefficient such as the resin film, at a temperature equal to or higher than the room temperature, in some cases, the positions of the opening patterns may be cumulatively deviated due to the internal stress of the resin film caused by the difference in thermal expansion between the two members.

Thus, the present invention seeks to cope with such a problem, and an object thereof is to provide a deposition mask production method and a laser processing apparatus, capable of improving positional accuracy in forming opening patterns by laser processing.

In order to achieve this object, a deposition mask production method according to a first aspect is a production method of a deposition mask including: a resin film in which a plurality of penetrating opening patterns is formed; and a magnetic metal member disposed in tight contact with one surface of the resin film and in which a plurality of through-holes each having a size capable of enclosing therein at least one of the plurality of opening patterns is provided. The deposition mask production method includes: a first step of forming a mask member having a structure in which the magnetic metal member provided with the through-holes is in tight contact with the one surface of the resin film; a second step of forming a plurality of preliminary opening patterns, each having a shape capable of being enclosed in the opening pattern, by subjecting the resin film to penetration processing by irradiating laser beams at predetermined regular positions in the plurality of through-holes; and a third step of performing laser processing so as to form each of the opening patterns on the corresponding preliminary opening pattern.

A laser processing apparatus according to a second aspect is a laser processing apparatus for processing a mask member having a structure in which a magnetic metal member provided with a plurality of through-holes is in tight contact with one surface of a resin film, the laser processing apparatus irradiating laser beams into the through-holes of the mask member, so as to form a plurality of penetrating opening patterns in the resin film. The laser processing apparatus includes: a stage configured to mount thereon the mask member and to be movable in a two-dimensional plane parallel to a mounting surface thereof; and a laser optical head configured to shape a beam cross-sectional shape of the laser beam in accordance with a shape of the opening pattern and to irradiate the shaped laser beams on the mask member. The laser optical head includes: a beam cross section shaping mask formed by arranging a first slit having a similar shape to the opening pattern and a second slit having a shape capable of being enclosed in the opening pattern and a similar shape to the preliminary opening pattern on a same substrate, and provided so as to be movable intersecting an optical path of the laser beam, or beam cross section shaping masks in which the first slit and the second slit are formed in different substrates, and switchablly provided with respect to the optical path of the laser beam; and a projection lens that performs reduction projection of the first and second slits on the mask member. The plurality of preliminary opening patterns is formed by subjecting the resin film to penetration processing by irradiating laser beams at predetermined regular positions in the through-holes, using the second slit of the beam cross section shaping mask, while moving the stage, and thereafter, each of the opening patterns is formed over the corresponding preliminary opening pattern by laser processing, using the first slit of the beam cross section shaping mask.

According to the present invention, each of the opening patterns is formed over the corresponding preliminary opening pattern in a state in which a part of the internal stress inherent in the resin film is released by forming, in advance, the preliminary opening patterns each having a shape capable of being enclosed in the opening pattern, and thus, it is possible to reduce the positional deviation of the opening patterns after forming the opening patterns. Accordingly, it is possible to improve the positional accuracy in forming the opening patterns by the laser processing.

BRIEF DESCRIPTION OF THE DRAWINGS

FIG. 1 is a flowchart illustrating an embodiment of a deposition mask production method according to the present invention.

FIGS. 2A to 2C are a configuration example of a deposition mask produced by the method of the present invention, in which FIG. 2A is a plan view, FIG. 2B is an enlarged plan view illustrating a part of FIG. 2A, and FIG. 2C is a cross-sectional view taken along with a line O-O.

FIGS. 5A and 5B are explanatory views regarding concerns at the time of forming the opening patterns of a composite-type deposition mask, in which FIG. 5A illustrates an ideal state and FIG. 5B illustrates positional deviation of the opening patterns.

FIGS. 6A and 6B are diagrams illustrating a configuration example of a laser processing apparatus according to the present invention, in which FIG. 6A is a front view and FIG. 6B is an explanatory view illustrating a configuration of a laser optical head.

FIGS. 8A and 8B are explanatory views regarding laser processing performed using the laser processing apparatus according to the present invention, in which FIG. 8A is a plan view, and FIG. 8B is an enlarged plan view illustrating a part thereof.

FIGS. 9A and 9B are explanatory views illustrating a state after forming preliminary opening patterns by the deposition mask production method according to the present invention, in which FIG. 9A illustrates entire positional deviation of the preliminary opening patterns, and FIG. 9B illustrates positional deviation of a preliminary opening pattern with respect to a regular position thereof.

DESCRIPTION OF PREFERRED EMBODIMENTS

Hereinafter, an embodiment of the present invention will be described in detail with reference to the accompanying drawings. FIG. 1 is a flowchart illustrating the embodiment of a deposition mask production method according to the present invention. The deposition mask production method is provided to produce a deposition mask having a structure in which a resin film provided with opening patterns is supported by a magnetic metal member having a thin plate shape, and includes step S1 of forming a mask member, step S2 of joining a frame, step S3 of forming a preliminary opening patterns, and step S4 of forming the opening patterns.

Figure 2A:
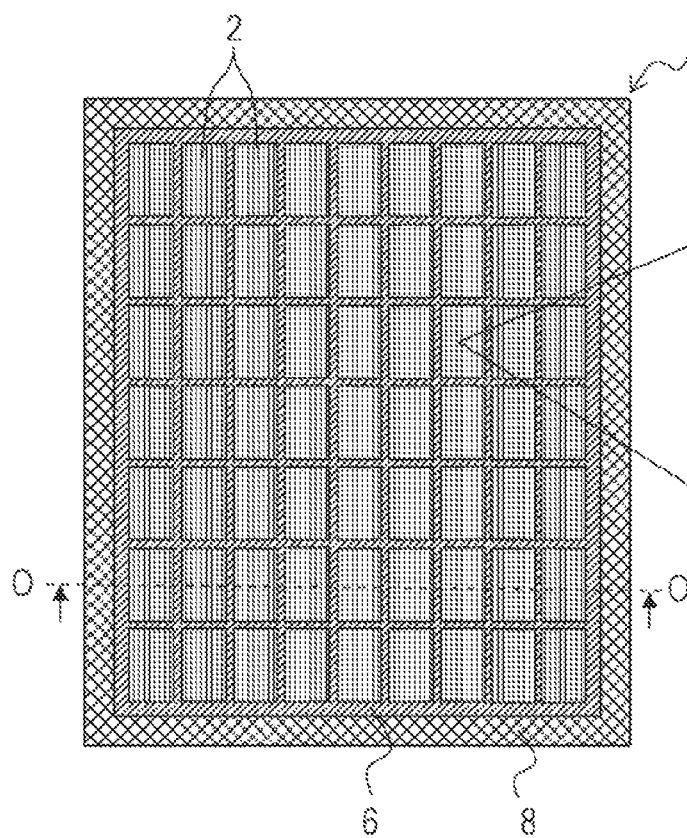
Figure 2B:
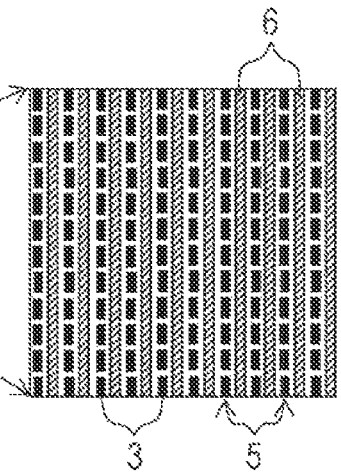
Figure 2C:
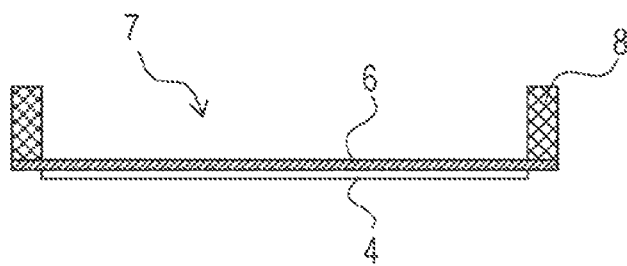

Here, as illustrated in FIGS. 2A to 2C, a description will be made regarding a production method of a deposition mask 1, for example, as a deposition mask 1 having a large area corresponding to a substrate having a large area and attached with a plurality of, for example, organic EL panels, and the deposition mask 1 in which a plurality of unit masks 2 is arranged corresponding to the plurality of panels. More specifically, the description will be made regarding the production method of the deposition mask 1 having a structure in which a magnetic metal member 6 having a thin plate shape and formed with a plurality of penetrating through-holes 5 each having a size capable of enclosing therein opening patterns 3 is in tight contact with one surface of a resin film 4 transmitting visible light and formed with a plurality of the penetrating opening patterns 3, each having the same shape and dimensions as those of a thin-film pattern to be formed (for example, an organic EL layer), at positions corresponding to the thin-film patterns, and the structure in which an end surface of a frame-shaped frame 8 having opening 7 having a size capable of enclosing therein the plurality of through-holes 5 is joined to a peripheral portion of the magnetic metal member 6 on a surface opposite to the surface with which the film 4 is in tight contact. Although, in FIGS. 2A to 2C, a configuration example of the deposition mask 1 in which the plurality of opening patterns 3 is provided in the stripe-shaped through-holes 5, is illustrated, the deposition mask 1 may be configured such that one opening pattern 3 is provided in each through-hole 5.

In step S1, a mask member 12 is formed to have the structure in which the magnetic metal member 6 provided with the penetrating through-holes 5 having the size capable of enclosing therein the opening patterns 3 is in tight contact with the one surface of the film 4. Hereinafter, a detailed description will be made with reference to FIGS. 3A to 3C.

Figure 3A:
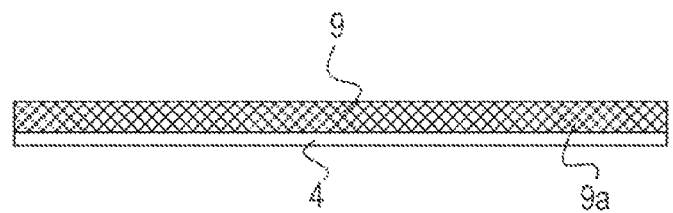
FIGS. 3A to 3C are explanatory views illustrating a forming process of a mask member of the deposition mask production method according to the present invention.

First, as illustrated in FIG. 3A, a magnetic metal sheet 9 of a magnetic metal material made of Invar or an Invar alloy, which has a thermal expansion coefficient of $1 \times 10^{-6}/°$ C. or less, and having a thickness of about 30 μm to 50 μm is cut in accordance with a surface area of a substrate, which is a deposition target. Furthermore, one surface 9a of the magnetic metal sheet 9 is coated with a resin solution of polyimide or the like, for example, and the resultant is cured at a temperature of about 200° C. to 300° C., so as to form the film 4 having a thickness of about 10 μm to 30 μm and transmitting the visible light.

Figure 3B:
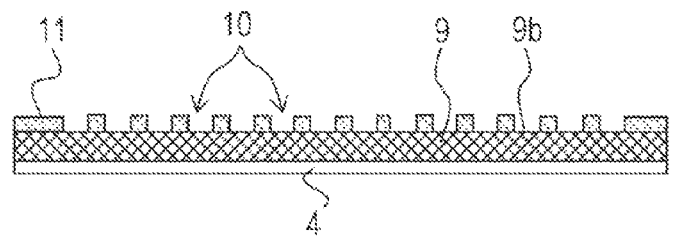

Subsequently, as illustrated in FIG. 3B, the other surface 9b of the magnetic metal sheet 9 is, for example, spray coated with resist, and the resultant is dried to form a resist film. Next, the resist film is exposed and developed using a photomask, and a resist mask 11 provided with a plurality of stripe-shaped openings 10 each having a size capable of enclosing therein the preliminary opening pattern or the opening pattern 3 is formed at a position corresponding to the plurality of preliminary opening patterns or opening patterns 3 to be formed in steps S3 and S4 to be described later.

Figure 3C:
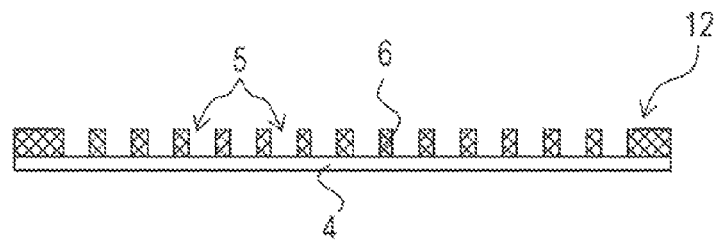

Subsequently, as illustrated in FIG. 3C, the magnetic metal sheet 9 is subjected to wet etching using the resist mask 11, parts of the magnetic metal sheet 9 corresponding to the openings 10 of the resist mask 11 are removed to form the magnetic metal member 6 provided with the stripe-shaped through-holes 5, and then the resist mask 11 is dissolved and removed using an organic solvent. In this manner, the mask member 12 in which the magnetic metal member 6 and the resin film 4 are in tight contact with one another is formed. An etching solution for etching the magnetic metal sheet 9 can be appropriately selected depending on a material of the magnetic metal sheet 9 to be used, and a well-known technique may be applied.

In addition, when the magnetic metal sheet 9 is etched to form the through-holes 5, an alignment mark provided on the mask ("mask alignment mark", not illustrated) for alignment with respect to an alignment mark provided on a substrate in advance ("substrate alignment mark"), may be formed at a predetermined position outside a formation area of the plurality of through-holes 5, at the same time. In this case, it is preferable an opening for the alignment mark be provided at a position corresponding to the mask alignment mark when forming the resist mask 11.

In step S2, the mask member 12 is provided under tension on one end surface of the frame-shaped frame 8 provided with the opening 7 having the size capable of enclosing therein the plurality of through-holes 5 of the magnetic metal member 6 and made of Invar or an Invar alloy, and a peripheral portion of the magnetic metal member 6 is joined to the one end surface of the frame 8. Hereinafter, a detailed description will be made with reference to FIGS. 4A to 4C.

Figure 4A:
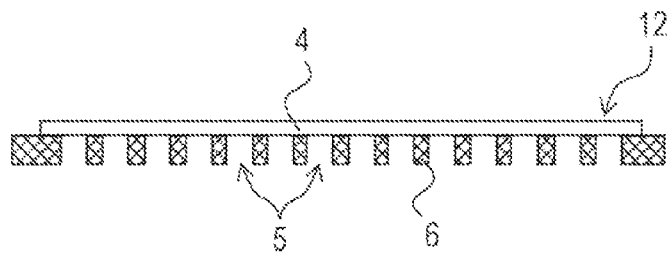
FIGS. 4A to 4C are explanatory views illustrating a joining process of a frame of the deposition mask production method according to the present invention.

First, as illustrated in FIG. 4A, a part of the resin film 4 corresponding to the peripheral portion of the magnetic metal member 6 is irradiated with laser beams L having a wavelength of 400 nm or less using a third harmonic wave or a fourth harmonic wave of a KrF (248 nm) excimer laser or a YAG laser, and the resin film 4 of the part is ablated and removed.

Figure 4B:
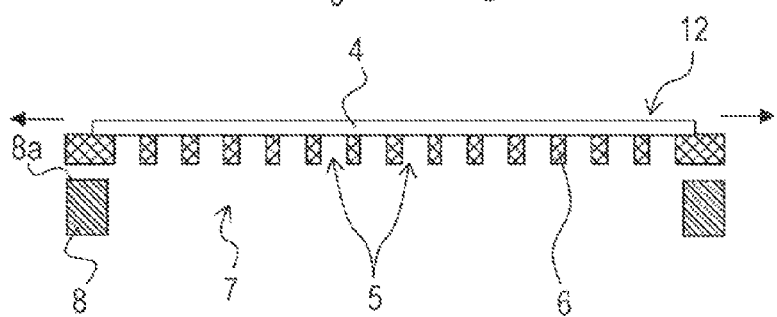

Next, as illustrated in FIG. 4B, the mask member 12 is positioned above the frame 8 in a state in which a tension having such an amount that the mask member 12 is not curved is applied to a side (direction of the arrows) parallel to the surface of the mask member 12.

Figure 4C:
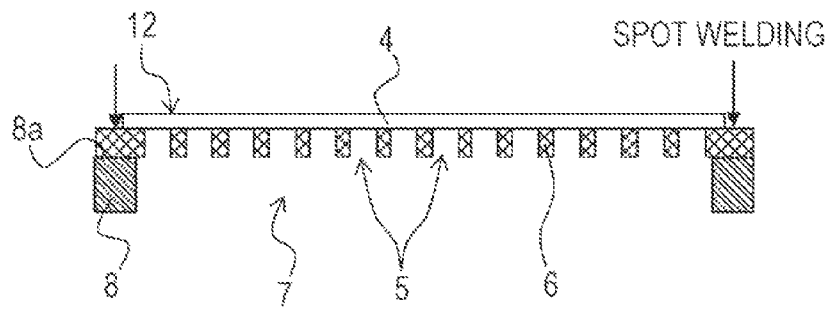

In addition, as illustrated in FIG. 4C, the mask member 12 is provided under tension on one end surface 8a of the frame 8 in a state in which the tension is applied to the side parallel to the surface of the mask member 12, and the peripheral portion of the magnetic metal member 6 and the frame 8 are spot-welded.

Figure 5A:
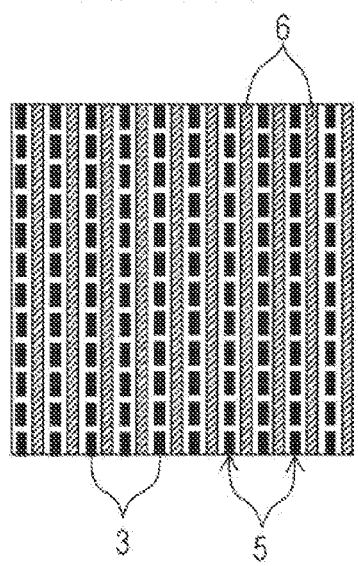

Meanwhile, as illustrated in FIG. 5A, the composite-type deposition mask 1 proposed by the inventor is configured to form the opening patterns 3 penetrating the resin film 4 by irradiating laser beams at predetermined regular positions into the plurality of through-holes 5 based on design values. In a case in which the Invar or the Invar alloy, which has thermal expansion coefficient of $1 \times 10^{-6}$/° C. or less, is used as the magnetic metal member 6, because the resin film 4, such as polyimide, has a thermal expansion coefficient of 3 to $5 \times 10^{-5}$/° C., which is one digit greater compared to that of the Invar or the Invar alloy, a balance is taken in the resin film 4 which has been cured at a temperature of 200° C. to 300° C. and then cooled to the room temperature, in a state in which tensile stress is applied in the direction parallel to the surface of the resin film 4 due to the difference between thermal expansion coefficients.

Figure 5B:
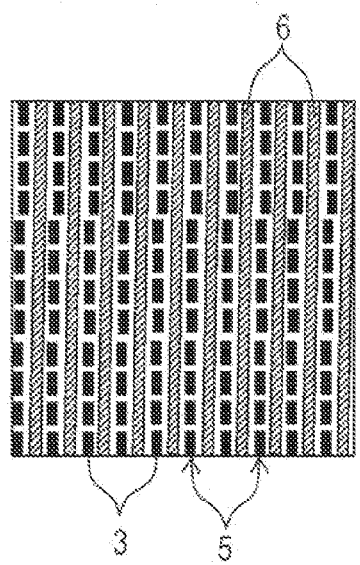

If the opening patterns 3 are formed in the resin film 4 in such a state, the balance is broken so that the resin film 4 is to deform. Thus, there has been a concern that the positions of the formed opening patterns 3 and through-holes 5 are deviated from the regular positions based on the design values as illustrated in FIG. 5B.

Here, in order to cope with such a problem, according to the production method of the deposition mask 1 according to the present invention, the plurality of preliminary opening patterns each having a shape capable of being enclosed in the opening pattern 3 is formed in advance in the regular positions, so as to release a partial internal stress of the resin film 4, so that the positional deviation of the preliminary opening patterns are intentionally caused, and then the opening patterns 3 are formed. Hereinafter, a detailed description will be made regarding steps S3 and S4 as characteristic parts of the production method of the deposition mask 1 according to the present invention.

Figure 6A:
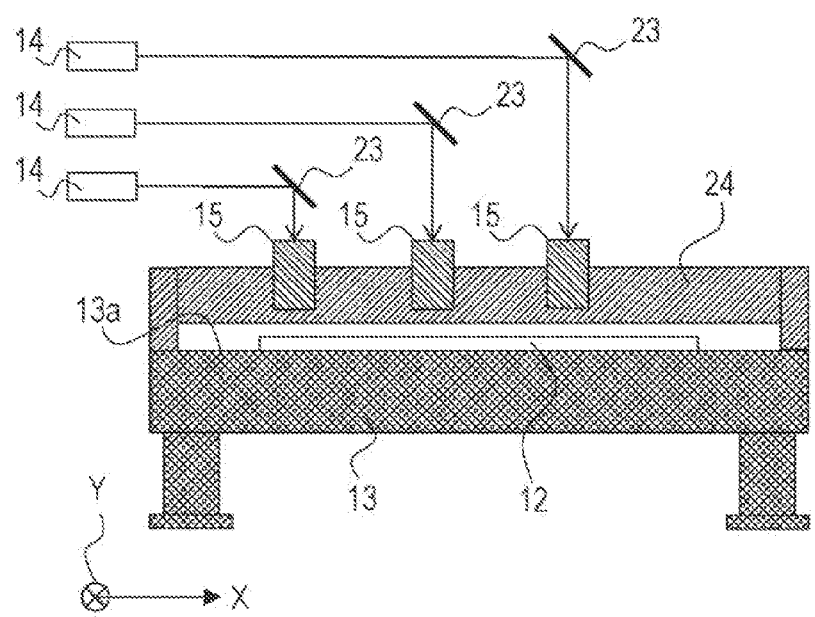
Figure 6B:
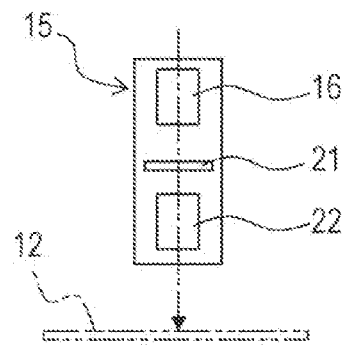

Steps S3 and S4 are performed using a laser processing apparatus illustrated in FIGS. 6A and 6B. The laser processing apparatus is configured to shape laser beam emitted from a pulse laser in accordance with a shape of the preliminary opening pattern or the opening pattern 3 and irradiate the shaped laser beams on the resin film 4, and the laser processing apparatus is provided with a stage 13, a pulse laser 14 and a laser optical head 15.

The stage 13 is configured to mount thereon the mask member 12 and to be movable in a two-dimensional plane (X-Y plane) parallel to a mounting surface 13a thereof, serving as an X-Y stage, and configured such that the movement thereof is controlled by a control unit (not illustrated) (for example, a personal computer).

The pulse laser 14 is provided above the stage 13. The pulse laser 14 is, for example, an Nd:YAG laser that emits laser beams having a wavelength of 355 nm. In this case, the irradiated laser beam is set such that the energy density is from 0.5 J/cm$^2$ to 1 J/cm$^2$, the pulse width is from 5 ns to 7 nsec, and the shot frequency is from 50 Hz to 60 Hz.

Figure 7:
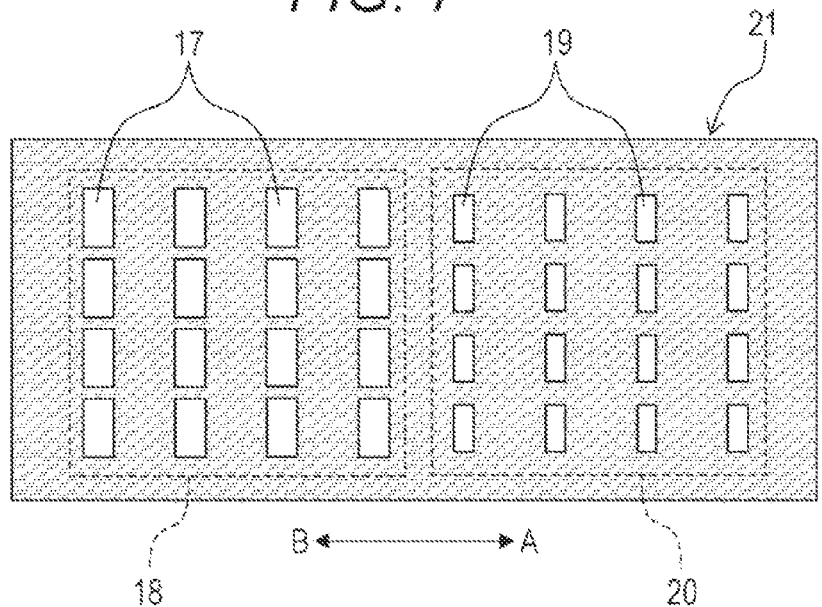
FIG. 7 is a plan view illustrating a configuration example of a beam cross section shaping mask for use in the laser processing apparatus according to the present invention.

The laser optical head 15 is provided at a downstream side of the laser beam of the pulse laser 14. As illustrated in FIG. 6B, the laser optical head 15 is configured to shape a beam cross-sectional shape of the laser beam in accordance with the shape of the opening pattern 3 or the preliminary opening pattern and irradiate the shaped laser beams on the mask member 12. The laser optical head 15 is configured to include: an illumination optical system 16 made up of, for example, a beam expander, an integrator, a condenser lens, and the like, which expands the laser beam emitted from the pulse laser 14 and supplies parallel light having uniform intensity distribution to a beam cross section shaping mask 21 to be described later; the beam cross section shaping mask 21, as illustrated in FIG. 7, formed by arranging a first mask area 18 in which a plurality of first slits 17 having a similar shape to the opening pattern 3 is formed, and a second mask area 20 in which a plurality of second slits 19 having a shape capable of being enclosed in the opening pattern 3, for example, and a similar shape to the preliminary opening pattern having an area of 80% of the opening pattern 3, and provided so as to be movable in directions of arrows A and B of FIG. 7 intersecting an optical path of the laser beam; and a projection lens 22 that reduces the first and second mask areas 18 and 20 to a size of, for example, 5 mm×5 mm and producing the resultant on the mask member 12. Then, a plurality of the laser optical heads 15 is provided to be arranged at a predetermined interval so as to enable the simultaneous laser processing of a plurality of areas of the substrate having a large area. FIG. 6A illustrates a laser processing apparatus provided with three pulse lasers 14 and three laser optical heads 15. In FIG. 6A, reference numeral 23 is a total reflection mirror, and reference numeral 24 is a support member which supports the laser optical heads 15. In addition, in the above-described embodiment, the description has been made regarding the case in which the beam cross section shaping mask 21 is formed by providing the plurality of first and second slits 17 and 19 in the same substrate, and the beam cross section shaping mask 21 is provided so as to be movable in a direction intersecting an optical axis of the laser optical head 15. However, the first and second slits 17 and 19 may be provided in different substrates, resulting in two beam cross section shaping masks 21, one being provided with the first slits 17 and the other with the second slits 19. The two beam cross section shaping masks 21 may be switched with respect to the optical axis of the laser optical head 15.

Hereinafter, a description will be made regarding the laser processing of the preliminary opening patterns and the opening patterns 3 performed using the laser processing apparatus.

In step S3, the resin film 4 is subjected to penetration processing by irradiating the laser beams at the predetermined regular positions based on the design values into the plurality of through-holes 5, so that the plurality of preliminary opening patterns having the shape capable of being enclosed in the opening patterns 3 is formed. Hereinafter, step S3 will be described in detail with reference to FIGS. 8A to 9B.

First, four sides of the quadrangular mask member 12 are abutted against positioning pins 28 provided to the mounting surface of the stage 13 so that the mask member 12 is positioned and mounted on the stage 13. At this time, it may be configured such that the mask member is adsorbed and fixed to the stage 13 by providing an adsorption unit such as a magnetic chuck to the stage 13.

Next, the mask alignment mark (not illustrated) provided at a predetermined position of the mask member 12 is imaged to detect the position thereof using, for example, an imaging camera (not illustrated), which is provided so as to be separated by a predetermined distance with respect to the optical axis of the projection lens 22 of any one laser optical head 15 among the plurality of laser optical heads 15. Then, the stage 13 is moved by a predetermined distance on the basis of the position of the mask alignment mark so that the plurality of laser optical heads 15 is positioned at processing start positions as illustrated in FIG. 8A.

Subsequently, the beam cross section shaping mask 21 is moved in the either direction of the arrow A or B so that the center of the second mask area 20 is matched with the optical axis of the laser optical head 15.

Subsequently, the pulse laser 14 is oscillated to emit the laser beam, and the second mask area 20 of the beam cross section shaping mask 21 provided to each laser optical head 15 is illuminated with the laser beam having an increased beam diameter and having intensity distribution made uniform. The laser beam is shaped to a plurality of beams having a similar shape to the preliminary opening pattern by the plurality of second slits 19 provided to the second mask area 20, and the beams are reduced in size by the projection lens 22, and then a shot area 27 of, for example, 5 mm×5 mm (see FIG. 8B) of the mask member 12 is irradiated with the reduced laser beams. In this manner, parts of the resin film 4 exposed through the through-holes 5 of the mask member 12 are ablated and subjected to laser processing, so that the plurality of preliminary opening patterns 26 is formed in the regular positions determined based on the design values (see FIGS. 9A and 9B). The three pulse lasers 14 are configured such that each output and shot timing thereof may be controlled separately.

Figure 8A:
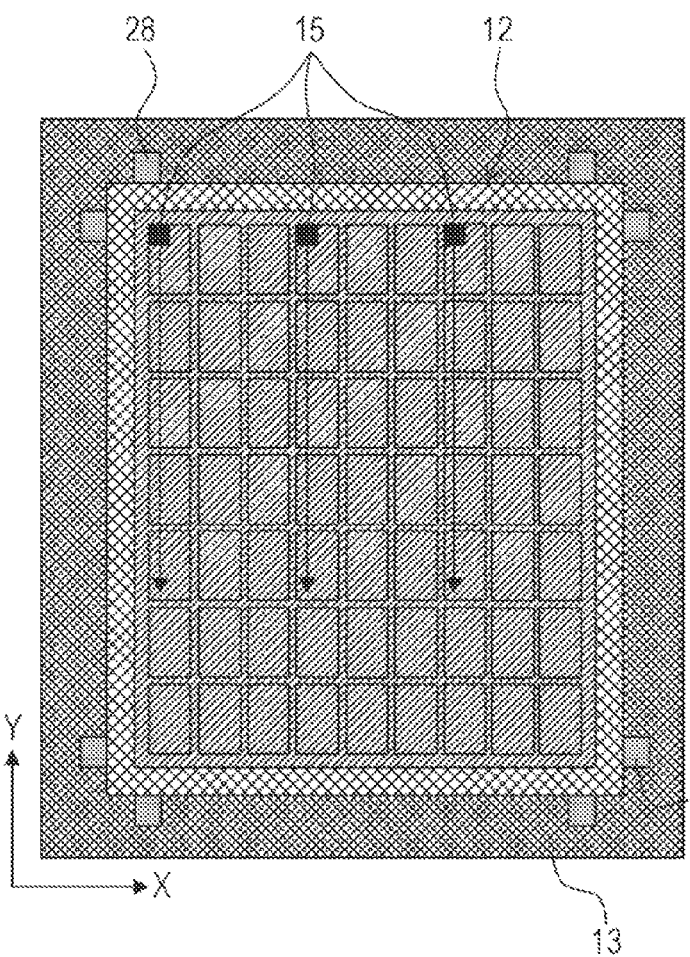
Figure 8B:
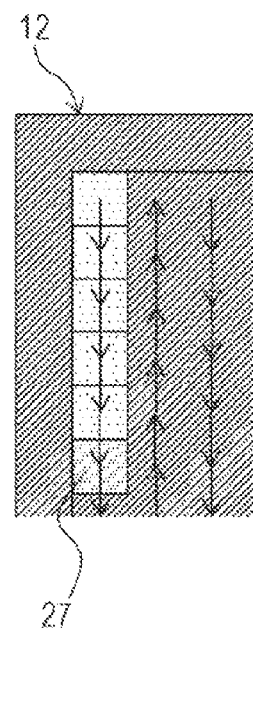

Next, as illustrated in FIG. 8A, the plurality of preliminary opening patterns 26 is sequentially processed at the regular positions while step-moving the stage 13 by a predetermined distance in a Y direction. In this case, the shot area 27 is sequentially moved as illustrated using arrows in FIG. 8B, for example, while step-moving the stage 13 in X and Y directions so as to form the preliminary opening patterns 26 over the entire surface of the mask member 12.

Figure 9A:
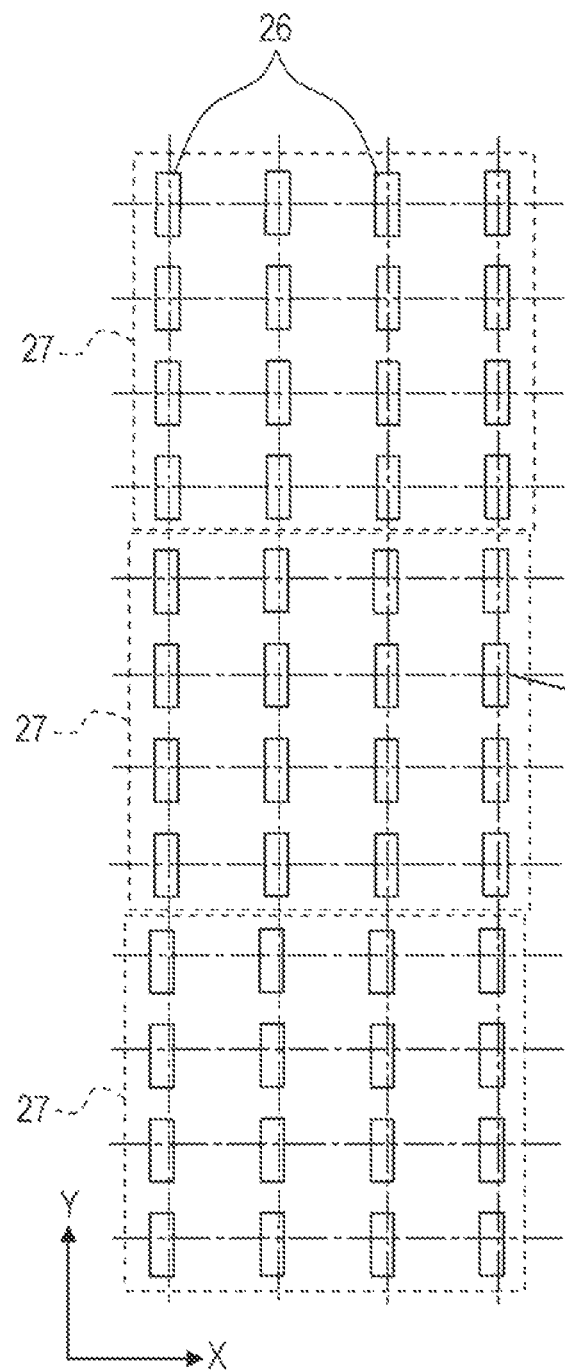
Figure 9B:
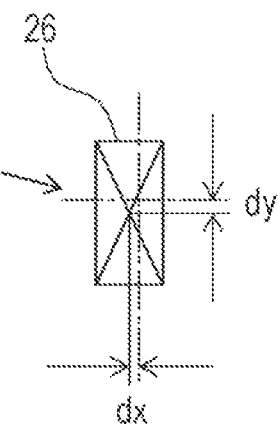

FIGS. 9A and 9B illustrate positions of the preliminary opening patterns 26 after the preliminary opening patterns 26 are formed. As illustrated in FIGS. 9A and 9B, when the preliminary opening patterns 26 are formed, a part of the internal stress (tensile stress toward the outside from the inside) inherent in the resin film 4 is released, and the resin film 4 is slightly contracted. Then, the contraction of the resin film 4 is stopped when a contractile force of the resin film 4 and a contraction prevention force due to the magnetic metal member 6 are balanced. Thus, the position (center position) of each preliminary opening pattern 26 is deviated by dx in the X direction and by dy in the Y direction from the regular position indicated by an intersection point of dashed lines as illustrated being enlarged in FIG. 9B. Although positional deviation amounts and a positional deviation direction of the preliminary opening pattern 26 vary depending on where in a plane of the mask member 12 the preliminary opening pattern 26 is formed, the deviation amount is about several μm at most.

In the following step S4, laser processing is performed to form each opening pattern 3 over the corresponding preliminary opening pattern 26. Hereinafter, step S4 will be described in detail with reference to FIG. 10. It is preferable that step S4 be performed without adsorbing the mask member 12 to the stage 13 using the adsorption unit such as the magnetic chuck, in order to reduce generation of the internal stress of the resin film 4.

First, the beam cross section shaping mask 21 is moved in the either direction of the arrow A or B so that the center of the first mask area 18 is matched with the optical axis of the laser optical head 15.

Next, similarly to step S3, the plurality of laser optical heads 15 is positioned at the processing start positions of the mask member 12.

Subsequently, the pulse laser 14 is oscillated to emit the laser beam, and the first mask area 18 of the beam cross section shaping mask 21 provided to each laser optical head 15 is illuminated with the laser beam having an increased beam diameter and having intensity distribution made uniform. The laser beam is shaped to a plurality of beams having a similar shape to the opening pattern 3 by the plurality of first slits 17 provided to the first mask area 18, and the beams are reduced in size by the projection lens 22, and then the shot area 27 of, for example, 5 mm×5 mm of the mask member 12 is irradiated with the reduced laser beams. In this manner, parts of the resin film 4 exposed through the through-holes 5 of the mask member 12 are ablated and subjected to laser processing, so that the plurality of opening patterns 3 is formed in the regular positions (position of an intersection point of dashed lines illustrated in FIG. 10) determined based on the design values, over the preliminary opening patterns 26.

Then, as illustrated in FIG. 8A, the plurality of opening patterns 3 is sequentially processed at the regular positions while step-moving the stage 13 by a predetermined distance in the Y direction. In this case, similar to the above, the shot area 27 is sequentially moved as illustrated using the arrows in FIG. 8B, for example, while step-moving the stage 13 in the X and Y directions so as to form the opening patterns 3 over the entire surface of the mask member 12.

Figure 10:
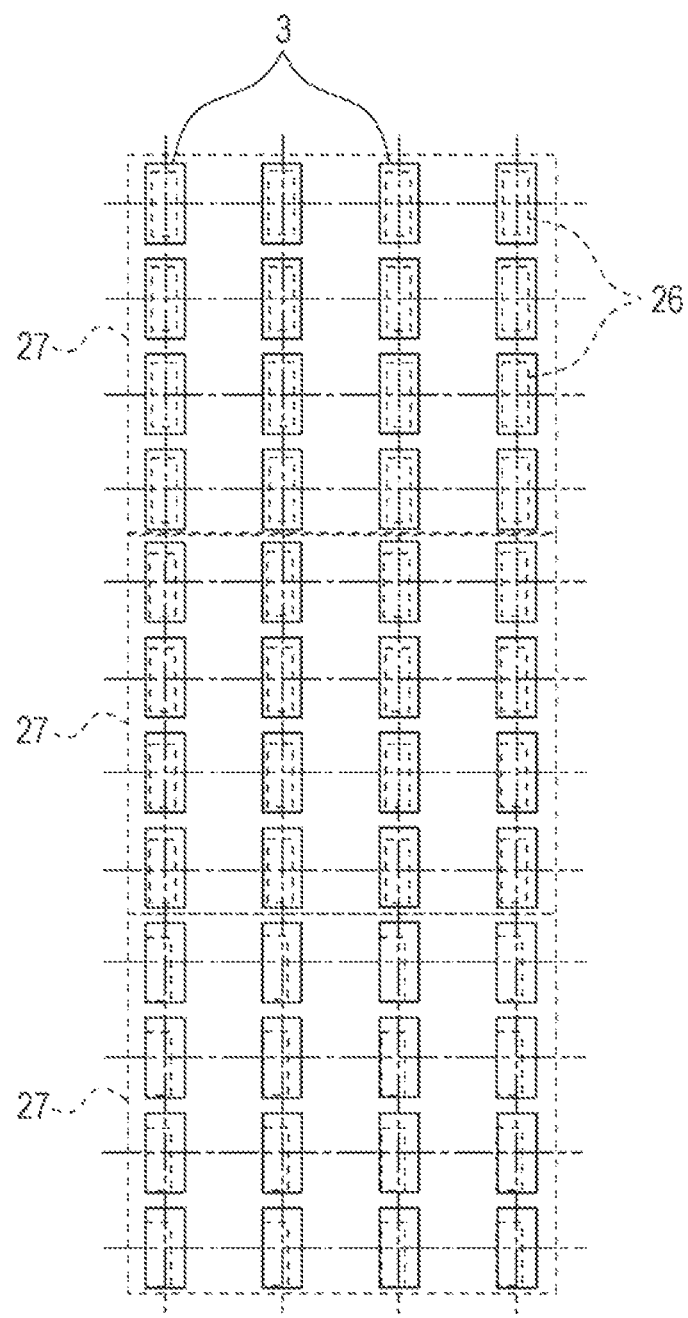
FIG. 10 is an explanatory view illustrating a state after forming the opening patterns by the deposition mask production method according to the present invention.

FIG. 10 illustrates positions of the opening patterns 3 after the opening patterns 3 are formed. Since a part of the internal stress inherent in the resin film 4 is released by forming the preliminary opening patterns 26, the positional deviation of the opening patterns 3 can be small even after the opening patterns 3 are formed, and the opening patterns 3 can be formed in the regular positions within an allowable range of the positional deviation. Since the preliminary opening pattern 26 has a sufficiently smaller area so as to be enclosed in the opening pattern 3, even the positional deviation occurs to the preliminary opening pattern 26, the deviated preliminary opening pattern 26 can be positioned inside the opening pattern 3.

Furthermore, it may be configured such that for each preliminary opening patterns 26, the preliminary opening pattern 26 is imaged to detect the center position thereof using an imaging unit, then positional deviation amounts (dx and dy illustrated in FIG. 9B) with respect to the regular position of the preliminary opening pattern 26 is measured, and the corresponding opening pattern 3 is formed with the positional deviation amounts corrected. In this case, as described above, since the positional deviation amounts and the positional deviation direction of the preliminary opening pattern 26 vary depending on where in the plane of the mask member 12 the preliminary opening pattern 26 is formed, each laser optical head 15 may be configured to be finely movable separately from other laser optical heads 15, in the X direction. In this manner, it is possible to form the opening patterns 3 by laser processing in the Y direction while finely moving the laser optical heads 15 separately in the X direction based on the positional deviation amounts of the corresponding preliminary opening patterns 26 so as to correct the positional deviation amounts.

Figure 11:
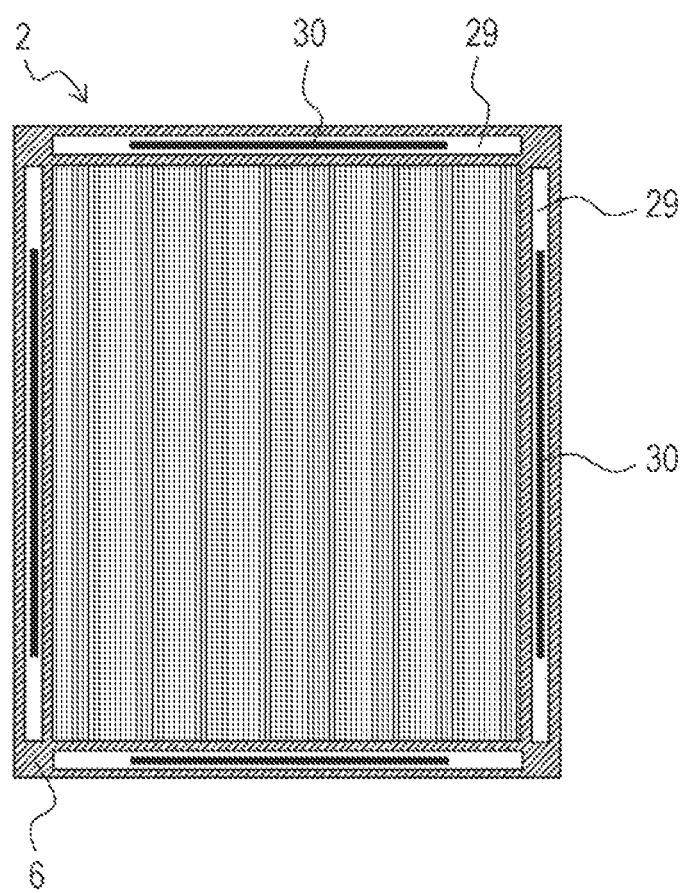
FIG. 11 is a plan view illustrating a modification example of a deposition mask produced by the method of the present invention.

When the positional deviation amounts of the preliminary opening patterns 26 are greater, and therefore, the deviated preliminary opening patterns cannot be positioned inside the opening patterns 3, it may be configured, as illustrated in FIG. 11, such that, in each unit mask 2 (see FIGS. 2A to 2C), dummy through-holes 29 extending in parallel to the outer periphery of the unit mask 2 are provided in advance, to the magnetic metal member 6 outside a deposition effective area enclosing therein the plurality of through-holes 5, and dummy opening patterns 30 are formed by laser processing in the resin film 4 exposed through the dummy through-holes 29 after forming the preliminary opening patterns 26. In this manner, the internal stress of the resin film 4 in the deposition effective area can be separated from the internal stress of the resin film 4 outside the deposition effective area, so that imbalance of distortion of the resin film 4 can be reduced. Accordingly, the positional deviation of the preliminary opening patterns 26 can be reduced, so that the positions of the preliminary opening patterns 26 can approximate the regular positions. Then, if the opening patterns 3 are formed in the regular positions thereafter, the preliminary opening patterns 26 can be positioned inside the opening patterns 3 and do not lie off the opening patterns 3. A shape of the dummy opening patterns 30, formation positions and the number thereof may be appropriately determined depending on the positional deviation amounts and the imbalance of the positional deviation of the preliminary opening patterns 26. Although in FIG. 11 there has been illustrated the case in which two pairs of the dummy through-holes 29 and two pairs of the dummy opening patterns 30, facing each other in each pair, are provided, one pair of the dummy through-holes 29 and one pair of the dummy opening patterns 30 may be provided at upper and lower sides, or at right and left sides in FIG. 11.

In a case in which the positional deviation amounts of the opening patterns 3 after forming the opening patterns 3 are too great so that the positional deviation amounts exceed an allowable value, it may be configured such that the dummy opening patterns 30 are formed after forming the opening patterns 3 to correct the positional deviation.

In the above-described embodiment, the description has been made regarding the production method of the deposition mask 1 having the large area corresponding to the substrate having the large area and attached with the plurality of, for example, organic EL panels, but not limited thereto, and the deposition mask 1 may correspond to the unit mask 2 illustrated in FIGS. 2A to 2C.

Furthermore, in the above-described embodiment, the description has been made regarding the case in which step S2 of joining the frame 8 to the mask member 12 is performed, but not limited thereto, and step S2 may be omitted.

In addition, the present invention is not limited to the deposition mask for forming an organic EL panel, but the present invention may be employed to any deposition mask as long as the deposition mask is configured to form a plurality of thin-film patterns on a substrate with favorable positional accuracy.

It should be noted that the entire contents of Japanese Patent Application No. 2013-013539, filed on Jan. 28, 2013, on which convention priority is claimed, is incorporated herein by reference.

It should also be understood that many modifications and variations of the described embodiments of the invention will be apparent to one skilled in the art without departing from the spirit and scope of the present invention as claimed in the appended claims.

What is claimed is:

1. A production method of a deposition mask including: a resin film in which a plurality of penetrating opening patterns is formed; and a magnetic metal member disposed in tight contact with one surface of the resin film and in which a plurality of through-holes each having a size capable of enclosing therein at least one of the plurality of penetrating opening patterns is provided, the production method comprising the sequential steps of:

a first step of forming a mask member having a structure in which the magnetic metal member provided with the plurality of through-holes is in tight contact with the one surface of the resin film;

a second step of forming a plurality of preliminary opening patterns over an entire surface of the mask member, each of the plurality of preliminary opening patterns having a shape capable of being enclosed in a corresponding one of the plurality of penetrating opening patterns so as to release internal stress of the resin film, by subjecting the resin film to penetration processing by irradiating laser beams at predetermined regular positions in the plurality of through-hole using, among a first slit and a second slit which are included by a laser processing apparatus, the second slit, wherein the first slit has a similar shape to the plurality of penetrating opening patterns and wherein the second slit has a shape capable of being enclosed in each of the plurality of penetrating opening patterns and a similar shape to the plurality of preliminary opening patterns; and a third step of performing laser processing using the first slit so as to form each of the plurality of penetrating opening patterns at a corresponding one of the predetermined regular positions over the entire surface of the mask member.

2. The production method according to claim 1, wherein each of the plurality of preliminary opening patterns is formed at a predetermined position based on a mask alignment mark provided in advance to the mask member.

3. The production method according to claim 1, wherein in the third step, positional deviation of the plurality of preliminary opening patterns, which has been caused after performing the second step, with respect to the predetermined regular positions is measured based on internal stress of the resin film caused by a difference in thermal expansion between the resin film and the magnetic metal member, and the positional deviation is corrected and then the plurality of penetrating opening patterns are formed.

4. The production method according to claim 1, wherein each of the plurality of preliminary opening patterns is formed at a predetermined position of the predetermined regular positions based on a mask alignment mark provided in advance to the mask member.

5. The production method according to claim 1, wherein between the first step and the second step, a peripheral portion of the magnetic metal member is joined to one end surface of a frame having an opening having a size capable of enclosing therein the plurality of through-holes.

* * * * *